US012801023B2

(12) United States Patent
Hou et al.

(10) Patent No.: US 12,801,023 B2
(45) Date of Patent: Nov. 17, 2026

(54) COPPER SURFACE PASSIVATION COMPOSITION, USE THEREOF, AND PHOTORESIST STRIPPER CONTAINING SAME

(71) Applicant: Zhejiang Aufirst Material Technology Co., Ltd., Quzhou (CN)

(72) Inventors: Jun Hou, Quzhou (CN); Jing LV, Quzhou (CN)

(73) Assignee: Zhejiang Aufirst Material Technology Co., Ltd., Quzhou (CN)

( * ) Notice: Subject to any disclaimer, the term of this patent is extended or adjusted under 35 U.S.C. 154(b) by 336 days.

(21) Appl. No.: 18/691,737

(22) PCT Filed: May 16, 2022

(86) PCT No.: PCT/CN2022/092986
§ 371 (c)(1),
(2) Date: Feb. 14, 2025

(87) PCT Pub. No.: WO2023/040308
PCT Pub. Date: Mar. 23, 2023

(65) Prior Publication Data

US 2025/0180997 A1 Jun. 5, 2025

(30) Foreign Application Priority Data

Sep. 14, 2021 (CN) ......................... 202111076657.2

(51) Int. Cl.
*G03F 7/42* (2006.01)
*C11D 3/00* (2006.01)
(Continued)

(52) U.S. Cl.
CPC .............. *G03F 7/422* (2013.01); *C23C 22/63* (2013.01); *G03F 7/42* (2013.01); *C11D 3/0073* (2013.01);
(Continued)

(58) Field of Classification Search
CPC ........................ C11D 3/0073; G03F 7/42–426
See application file for complete search history.

(56) References Cited

U.S. PATENT DOCUMENTS

| | | | |
|---|---|---|---|
| 5,411,677 | A | 5/1995 | Pickering et al. |
| 2004/0106531 | A1 | 6/2004 | Kanno |

(Continued)

FOREIGN PATENT DOCUMENTS

| | | | |
|---|---|---|---|
| CN | 113921383 A | | 1/2022 |
| WO | 2009158552 A1 | | 12/2009 |
| WO | 2023040308 A1 | | 3/2023 |

OTHER PUBLICATIONS

Silvan Saleviter et al., "Optical and structural characterization of immobilized 4-(2-pyridylazo)resorcinol in chitosan-graphene oxide composite thin film and its potential for Co2+ sensing using surface plasmon resonance technique," Results in Physics, vol. 11, pp. 118-122 (Elsevier 2018). (Year: 2018).*

(Continued)

*Primary Examiner* — Kaj K Olsen
*Assistant Examiner* — Richard Z. Zhang
(74) *Attorney, Agent, or Firm* — Flener IP & Business Law

(57) ABSTRACT

The present invention relates to a copper surface passivation composition, comprising 4-(2-pyridineazo) resorcinol and glucosamine derivatives, and also relates to a photoresist stripper containing same and a method for cleaning a copper substrate. The copper surface passivation composition provides a good copper passivation protection performance, so that the copper surface passivation composition can be used for photoresist removal and copper surface passivation protection in a bumping process of semiconductor back-end packaging with good industrial application prospects and promotion potential in the technical field of microelectronics.

20 Claims, 3 Drawing Sheets

(51) Int. Cl.
*C23C 22/63* (2006.01)
*C23G 5/02* (2006.01)
*H10P 70/00* (2026.01)

(52) U.S. Cl.
CPC ................ *C23G 5/02* (2013.01); *G03F 7/425* (2013.01); *H10P 70/27* (2026.01)

(56) References Cited

U.S. PATENT DOCUMENTS

2010/0159400 A1 6/2010 Hong et al.
2017/0010535 A1 1/2017 Fujitani et al.
2019/0101830 A1 * 4/2019 Ge ............................ B08B 3/08

OTHER PUBLICATIONS

International Search Report for PCT/CN2022/092986; issued Jul. 12, 2022.

* cited by examiner

COPPER SURFACE PASSIVATION COMPOSITION, USE THEREOF, AND PHOTORESIST STRIPPER CONTAINING SAME

CROSS-REFERENCE TO RELATED APPLICATIONS

This application claims priority benefit of Chinese Patent Application No. 202111076657.2 filed Sep. 14, 2021, which is incorporated herein in its entirety by reference.

TECHNICAL FIELD

The present invention relates to a complex composition used in a semiconductor preparation process and use thereof, and specifically relates to a copper surface passivation composition for the passivation of copper surface, used thereof and a photoresist stripper containing the composition. The present invention pertains to the application field of microelectronic technology.

BACKGROUND

Metallic copper (Cu) is widely used in the semiconductor field, such as in the front-end manufacturing process and back-end packaging process of semiconductors. In the front-end process of IC manufacturing, the conventional $Al/SiO_2$ interconnect material line can no longer meet the technical requirements as the feature size continues to decrease due to the advancement of the manufacturing process. In order to reduce the interconnect RC delay, IBM first adopted the Dual Damascene Process for Cu line interconnect in 1997. Below the 0.13 m process node, copper has replaced aluminum as the new interconnect material. Compared with aluminum, copper has better conductivity, reduces resistance-capacitance delay and inhibits electromigration, thereby resulting in better effects. Among them, copper electroplating plus chemical mechanical polishing (CMP) is an essential process for realizing the preparation of multi-layer copper interconnect line.

While in the back-end packaging process, as the input/output (I/O) density increases rapidly, the pitch of the bump is correspondingly required to be continuously reduced to comply with the requirement of fine pitch, a bumping technology using copper pillar bump (Cu pillar) as a semiconductor bump emerged. The minimum pitch that can be achieved with the original solder bump is 150 m, while the copper pillar bump can achieve a high-density package with a minimum pitch of less than 40 m. Moreover, compared with solder bump, the copper pillar bump exhibits better heat dissipation performance and electronic mobility.

Precisely because of the above advantages, the copper pillar bump has now been widely used in various types of flip chip interconnect processes, which provide various design possibilities while meeting current and future ROHS requirements. The copper pillar bump can be perfectly suitable for a variety of specific applications that require a combination of small pitch, RoHS/green compliance, low cost, and electromigration property, e.g., a transceiver, an embedded processor, an application processor, power management, alkali band, ASIC and SOC, etc.

As described above, metallic copper is widely used in both the front-end and back-end manufacturing of microelectronic devices, and during these front-end and back-end manufacturing processes, copper would be inevitably exposed to chemical solutions (e.g., CMP, cleaners, etc.), which can lead to copper corrosion, which in turn leads to a decrease in product yield. In addition, there would be a variety of residues left on the semiconductor substrate after CMP treatment, which may cause damage or serious corrosion to the copper line, resulting in serious roughness of metal line, and ultimately leading to finished products with poor electrical performance.

Therefore, in order to overcome the corrosion and improve the product yield, it is very necessary to perform passivation treatment on the surface of the metallic copper. Scientific researchers have also carried out a lot of in-depth studies to reduce the corrosion of metallic copper. For example:

CN101815811A discloses a composition for treating copper surface, wherein the corrosion or etching rate of metallic copper is lower when a dithiocarbamate compound is jointly used with a chelating agent hydroxybenzene than that when the dithiocarbamate compound is used alone or it is used with any other chelating agents. That is, the combination of a dithiocarbamate compound and the chelating agent hydroxybenzene shows a synergistic effect on the passivation of copper surface.

U.S. Pat. No. 7,923,423A discloses a alkaline aqueous cleaning composition used after CMP process. The composition includes at least one amine, at least one passivating agent, at least one optional quaternary alkali, at least one optional reducing agent, and water. The passivating agent is selected from a variety of triazole compounds, thiazole compounds, imidazole compounds, imidazolinone compounds, benzoic acid, tricresyl phosphate, ammonium benzoate, etc., which can reduce the corrosion of metal line such as copper line.

CN101874093A discloses a chemical mechanical polishing (CMP) method and composition for polishing copper-containing substrates, wherein the CMP composition includes a granular abrasive, a copper complexing agent, a copper passivating agent and an aqueous carrier, and the copper passivating agent carries an acidic OH group and an additional oxygen substituent in a 1,6 relationship to the acidic OH group, which may be, for example, in the form of an N-acyl sarcosine compound or a salt thereof, partially neutralized.

CN102197124A discloses a cleaning composition and method for cleaning residues and contaminants from microelectronic devices containing the residues and contaminants thereon after chemical mechanical polishing (CMP). The cleaning composition includes corrosion inhibitors. The composition enables efficient cleaning of post CMP residues and contaminants from the surface of microelectronic devices without damaging low-k dielectric materials or copper interconnect materials. The corrosion inhibitors include ribosylpurine and methylated or deoxylated derivatives thereof, degradation products of adenosine and adenosine derivatives, purine-glycoconjugates, methylated or deoxylated purine derivatives, and reaction or degradation products of these substances, which can realize good inhibition for metallic copper corrosion.

CN104395989A discloses a method for removing residues and contaminants from microelectronic devices using a cleaning composition. The cleaning composition includes at least one quaternary alkali, at least one amine, at least one corrosion inhibitor, and at least one solvent. The corrosion inhibitor includes pyrazole, a pyrazole derivative, phosphoric acid, a phosphoric acid derivative, ascorbic acid, adenosine, an adenosine derivative, and a combination thereof. The cleaning composition has a good copper corrosion inhibition effect because of the corrosion inhibitor therein.

CN1784487A discloses a cleaning composition for cleaning photoresists and residues on the microelectronic substrates. The cleaning composition includes a corrosion inhibiting compound having multiple hydroxy groups, the structure of which is $T_1$-$[(CR_1R_2)_m$—$(CR_3R_4)_n]_p$—$(CR_5R_6)_q$-$T_2$, wherein at least one of $R_1$ and $R_2$ is OH, if one of $R_1$ and $R_2$ is not OH, it is selected from H, alkyl and alkoxy, m is an integer of 1 or greater, $R_3$ and $R_4$ are selected from H, alkyl and alkoxy, n is 0 or a greater positive integer, p is an integer of 1 or greater; at least one of $R_5$ and $R_6$ is OH, if one of $R_5$ and $R_6$ is not OH, it is selected from H, alkyl and alkoxy, q is an integer of 1 or greater; $T_1$ and $T_2$ are selected from H, alkyl, hydroxyalkyl, polyhydroxyalkyl, aminoalkyl, carbonylalkyl and amido, or $T_1$ and $T_2$ can be connected to form a structure selected from an alicyclic structure or condensed ring structure. Due to the presence of the polyhydroxy corrosion inhibiting compound, the composition is non-corrosive to copper-metallized microelectronic substrates and is capable of cleaning photoresists, plasma, and etching residues from the substrates and cleaning aluminum-metallized microelectronic substrates in a non-corrosive manner, having a good non-metal corrosion performance in the field of microelectronics.

TW90115043A discloses a method for preparing semiconductor elements in which copper is prevented from corrosion after chemical mechanical polishing, wherein a solution containing a corrosion inhibitor is used, the corrosion inhibitor is selected from a group consisting of indazole, benzimidazole, mercaptobenzothiazole or imidazolidinethione. the corrosion inhibitor performs well in preventing copper corrosion.

CN1575328A discloses a post-CMP cleaner, which can effectively remove residues after the resist ashing step without corroding and potentially stripping the fine structures which should be left on the wafer. The cleaner includes fluoride sources, organic amine, nitrogen-containing components selected from nitrogen-containing carboxylic acids and imine, water, and a metallic chelating agent, wherein nitrogen-containing carboxylic acid or imine can provide functional groups that can specifically bind to free copper atoms, so that the copper specific corrosion inhibitor C that may contact with the copper surface during the residue removal process will bind to the copper surface and form a protective layer to prevent the copper surface from being corroded by the cation $A^+$ and anion $X^-$ in the cleaning agent.

CN105261554A discloses a copper corrosion-inhibiting cleaning composition, which provides the corrosion inhibition effect by a combination of two chemicals: at least one polyfunctional amine with more than one amino group and at least one polyfunctional acid with more than one carboxylic acid group, wherein the polyfunctional amine is selected from polyethyleneimine, triamine, pentamine, hexamine and a combination of the above amine, and the polyacid is selected from (i) dicarboxylic acid, dicarboxylic acid having aromatic moieties, and a combination thereof; (ii) tricarboxylic acid, tricarboxylic acid having aromatic moieties, and a combination thereof, and (iii) tetracarboxylic acid, tetracarboxylic acid with aromatic moieties, and a combination thereof. The metal corrosion-inhibiting cleaning composition can effectively clean residues derived from ashing of high-density plasma with oxygen-containing plasma after etching, and slurry particles and residues left after the chemical mechanical polishing (CMP), exhibiting very excellent corrosion inhibiting effect on metallic copper.

CN112424327A discloses a cleaning composition for cleaning the substrate of a microelectronic device in a process. The cleaning composition includes water, an alkali for providing a pH of at least 8, a cleaning compound, and a corrosion inhibitor selected from a guanidine functional compound, a pyrazolone functional compound, and a hydroxyquinoline compound. The cleaning composition can cause a higher degree of copper passivation, thereby greatly reducing the corrosion of copper.

TW200745384A discloses a copper wire specialized cleaning agent with excellent copper wire corrosion inhibiting effect (copper corrosion inhibiting effect), which contains a copper corrosion inhibitor (RE) and water (W), and its pH at 25° C. is 3-14, and meets Formula (1): $0.49 \leq \{E+0.059 \times pH\} \leq 0.93$, where E indicates the redox potential at 25° C. (V), and pH indicates the pH at 25° C. The copper corrosion inhibitor is at least one selected from a free water-soluble reducing agent and a complexing agent, i.e., quaternary ammonium hydroxide. The specialized cleaning agent can exhibit excellent copper corrosion inhibiting effect and can be used in the manufacture of semiconductor substrates or semiconductor elements with copper line patterns.

CN103228775A discloses a cleaning agent for copper line substrate. The cleaning agent can sufficiently inhibit the dissolution of metallic copper and remove impurities or particles such as copper (II) hydroxide and copper (II) oxide generated in the chemical mechanical polishing (CMP) process. The cleaning agent consists of an aqueous solution containing an amino acid and alkyl hydroxylamine, and does not have any adverse effects on the coating of a 1-valent copper and a metal anticorrosive agent, such as a Cu(I)—BTA coating (metal anticorrosive film layer). On the other hand, the cleaning agent can remove the coating of a 2-valent copper and a metal anticorrosive agent, such as a Cu(II)-QCA coating (metal anticorrosive film layer). Therefore, the cleaning agent is suitable for cleaning copper line or copper alloy line semiconductor substrates that have formed a metal anticorrosive film layer thereon.

CN105143517A discloses a cleaning composition used in the field of microelectronics, which includes at least one solvent, at least one corrosion inhibitor, at least one amine, at least one quaternary alkali, and at least one surfactant, wherein the corrosion inhibitor includes a substance selected from: adenosine, adenine, methylated adenine, methylated adenine, a adenosine derivative (which is selected from 2-methoxyadenosine, N-methyl adenosine, N,N-dimethyl adenosine, trimethylated adenosine, trimethyl N-methyl adenosine, C-4'-methyl adenosine, 3-deoxyadenine, and a combination thereof), an adenosine degradation product, and a combination thereof, which can reduce copper loss while improving the cleaning efficiency, and prevent the redeposition of slurry particles, further improving the cleaning performance on various substrates of microelectronics.

CN102338994A discloses a cleaning solution with low etching ability suitable for cleaning a relatively thick photoresist, which includes potassium hydroxide, a pyrrolidone solvent, pentaerythritol, alcohol amine and resorcinol. The photoresist cleaning agent can be used for removing photoresists and other residues on metallic, metal alloy or dielectric substrates, while having a relatively lower etching rate on metals such as Cu and providing good application prospects in the microelectronic field of semiconductor chip cleaning.

CN109195720A discloses a stripping composition for removing a photoresist from a semiconductor substrate, which includes: (1) at least one water-soluble polar aprotic organic solvent; (2) at least one quaternary ammonium hydroxide; (3) at least one compound containing at least three hydroxyl groups; (4) at least one carboxylic acid; (5) at least one Group II metal cation; (6) at least one copper corrosion inhibitor selected from a group consisting of 6-substituted-2,4-diamino-1,3,5-triazine; and (7) water. The composition can effectively strip positive or negative photoresist or photoresist residues, but is non-corrosive to the bumps on the semiconductor substrate and the bottom metallic materials (such as, SnAg, CuNiSn, CuCoCu, CoSn, Ni, Cu, Al, W, Sn, Co, etc.).

CN101076760A discloses a nonaqueous cleaning composition, which is used for removing photoresists and residues from microelectronic substrates. The cleaning composition includes: one or more polar organic solvents, one or more organic hydroxylated amines, and one or more corrosion inhibitor polymers in a corrosion inhibiting amount. The polymer has a plurality of pendant functional groups on its backbone, and the pendant functional groups are selected from amino groups and hydroxyl groups, such as polyethyleneimine and poly(vinyl alcohol-co-ethylene), etc. In addition to being substantially non-corrosive to copper metallized microelectronic substrates and capable of removing photoresists, plasma and etching residues from such substrates, the cleaning composition is also capable of cleaning aluminum metallized microelectronic substrates in a similarly non-corrosive manner.

CN103923765A discloses a cleaning agent composition used in a process for manufacturing semiconductors and displays, which includes 0.01-3 wt % of amino acid chelating agent, 0.01-0.5 wt % of organic acid, 0.01-1.0 wt % of inorganic acid, 0.01-5 wt % of alkali compound, and 0.01-98 wt % of deionized (DI) water, so that the composition is a water-based alkali at pH 8 to 13, and can remove particles and organic contaminants while preventing reverse adsorption and copper corrosion. The composition may further include benzoic acid or a benzotriazole corrosion inhibitor. The composition has improved the performance of removing metal impurities and removing organic contaminants while inhibiting copper corrosion and reverse adsorption. The composition can be used in copper etching, residue removal and many other applications by controlling the etching rate.

CN105022237A discloses a novel cleaning solution containing: a) quaternary amine hydroxide, (b) alcohol amine, (c) a solvent and (d) saccharic acid or saccharic acid lactone. The cleaning solution contains saccharic acid or saccharic acid lactone as the primary metal corrosion inhibitor, which can be used alone or in combination with a star copolymer with pigment affinity groups, so that the cleaning solution can effectively protect substrates such as metals aluminum and copper from corrosion while effectively removing the photoresist on the wafer, and the cleaning solution can be directly rinsed with water after cleaning the wafer. Therefore, the cleaning solution has good application prospects in the microelectronic field of metal cleaning and semiconductor chip cleaning.

CN107664930A discloses a photoresist cleaning solution for a semiconductor wafer, which includes, in mass percentages, the following components: 32-36% of quaternary ammonium hydroxide, 14-18% of alcohol amine, 7-11% of pentaerythritol, 6-8% of hexahydric alcohol, 0.1-1% of 3-amino group-5-mercapto-1,2,4-triazole, 22-26% of surfactant, and the rest is cosolvent. Compared with the present art, in this application, an appropriate ratio of quaternary ammonium hydroxide/alcohol amine is used in favor of coordinating the photoresist removal ability and the anti-corrosion of metal microspheres; hexahydric alcohol is used, which has strong corrosion inhibition for both aluminum and copper; and alcohol amine with strong removal ability is used as a solvent to dissolve potassium hydroxide and pentaerythritol.

CN108121175A discloses a fluorine-containing cleaning solution, which includes fluoride, organic amine, organic solvent, water and hydrazine, and derivatives thereof. The cleaning solution has a strong cleaning ability to effectively remove plasma etching residues generated in the manufacturing process of semiconductors, especially the residues after ashing in the copper damascus process. In addition, the cleaning solution has a relatively lower corrosion rate to non-metallic materials (such as silicon oxynitride and low dielectric materials) and metallic materials (such as Cu) in cleaning conducted by a high-speed single wafer machine, so it is suitable for batch immersing cleaning and batch rotary spraying cleaning, especially suitable for rotary cleaning of a high-speed single wafer machine, which overcomes the defects in the traditional cleaning solution for copper corrosion inhibition with good application prospects in the microelectronic field of semiconductor chip cleaning.

As described above, a variety of auxiliary solutions used in different stages of semiconductor manufacturing for reducing the corrosion of copper have been disclosed in the prior art. However, it is still necessary and essential to continue on researching new copper passivation compositions. It is driven by such industry needs and the intrinsic motivation of industry research and development that has led to the completion of the present invention.

SUMMARY OF THE INVENTION

An object of the present invention is to provide a safe, environmentally friendly, and high-efficient copper passivation composition, especially the composition can show a very low corrosion rate on copper, to reduce the corrosion of metallic copper during the manufacturing of semiconductors, which helps to improve the production efficiency and the product yield. The composition can be used for removing the photoresist during the bumping process for the back-end packaging of semiconductors. Therefore, the present invention further provides use of the composition and a photoresist stripper containing the composition, as well as a preparation method and an application of the photoresist stripper. A variety of technical solutions involving the composition, the use, the photoresist stripper and the preparation method and application thereof above have potentially great application prospects and potential in the field of semiconductor technology.

It should be noted that, in the present invention, unless otherwise specified, the specific meaning of "include" relating to composition definition and description contains both open-ended "include", "contain" and the like, and closed-ended "consist of" and the like.

In the first aspect, an object of the present invention is to provide a copper surface passivation composition, the copper surface passivation composition includes 4-(2-pyridineazo) resorcinol (also referred to as "4-(2-pyridineazo)-1,3-resorcinol") and a glucosamine derivative.

In the copper surface passivation composition, the mass ratio of 4-(2-pyridineazo) resorcinol to the glucosamine derivative is preferably 1:1-5, e.g., 1:1, 1:2, 1:3, 1:4 or 1:5.

In the copper surface passivation composition, the mass ratio of 4-(2-pyridineazo) resorcinol to the glucosamine derivative is more preferably 1:2-4, most preferably 1:3.

In the copper surface passivation composition, the glucosamine derivative is preferably any one of D-glucosamine, N-acetyl-D-glucosamine, chitosan oligosaccharide and carboxymethyl chitosan, or a combination of any multiple thereof, the most preferred glucosamine derivative is N-acetyl-D-glucosamine.

In the second aspect, an object of the present invention is to provide a photoresist stripper, which includes, in parts by mass, the following components:

| | |
|---|---|
| copper surface passivation composition | 0.01-1 |
| water-soluble organic solvent | 60-90 |
| alkali | 2-40 |
| polyol | 5-30 |
| deionized water | 1-10 |

In the photoresist stripper, the copper surface passivation composition is as described above and will not be repeated here.

Wherein, the mass fraction of the copper surface passivation composition is 0.01-1 part, e.g., 0.01 part, 0.05 part, 0.1 part, 0.5 part, or 1 part.

In the photoresist stripper, the mass fraction of the water-soluble organic solvent is 60-90 parts, e.g., 60 parts, 70 parts, 80 parts, or 90 parts.

Wherein, the water-soluble organic solvent is any one of sulfone, sulfoxide, alcohol ether, amide, and pyrrolidone, or a combination of any multiple thereof.

Wherein, the sulfone is preferably sulfolane.

Wherein, the sulfoxide is preferably dimethyl sulfoxide.

Wherein, the alcohol ether is any one of ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, and propylene glycol monobutyl ether, or a combination of any multiple thereof.

Wherein, the amide is any one of N-methylformamide, N,N-dimethylformamide, N,N-dimethylacetamide, acetamide, N-ethylformamide and N,N-diethylformamide, or a combination of any multiple thereof.

Wherein, the pyrrolidone is N-methyl pyrrolidone or N-ethyl pyrrolidone, or a combination of these two in any proportion.

In the photoresist stripper, the mass fraction of alkali is 2-40 parts, e.g., 2 parts, 5 parts, 10 parts, 15 parts, 20 parts, 25 parts, 30 parts, 35 parts or 40 parts.

Wherein, the alkali is an organic alkali, more specifically, quaternary ammonium hydroxide or alkanolamine.

Wherein, the quaternary ammonium hydroxide may be, for example, any one of tetramethylammonium hydroxide, tetraethylammonium hydroxide, tetra-n-propylammonium hydroxide, tetra-n-butylammonium hydroxide, benzyl trimethyl ammonium hydroxide, and choline hydroxide, or a combination of any multiple thereof.

Wherein, the alkanolamine is any one of monoethanolamine, diethanolamine, triethanolamine, N,N-dimethyl ethanolamine, N-ethyl ethanolamine, N-n-butyl ethanolamine, monoisopropanolamine, diisopropanolamine, triisopropanolamine, and diglycolamine, or a combination of any multiple thereof.

In the photoresist stripper, the mass fraction of polyol is 5-30 parts, e.g., 5 parts, 10 parts, 15 parts, 20 parts, 25 parts or 30 parts.

Wherein, the polyol is any one of ethylene glycol, diethylene glycol, 1,2-propanediol, and 1,3-propanediol, or a combination of any multiple thereof.

In the photoresist stripper, the mass fraction of deionized water is 1-10 parts, e.g., 1 part, 3 parts, 5 parts, 7 parts, 9 parts or 10 parts.

It should be noted that, deionized water may be added alone to form the photoresist stripper, and may also be added in a form of a solution with all or part thereof as a solvent for other components (for example, by dissolving any one or more of a water-soluble organic solvent, a alkali or a polyol therein to form a solution, and when part of deionized water is used as the solvent, the remaining part may be added separately rather than in the form of a solution).

In the third aspect of the present invention, it provides a preparation method for the photoresist stripper, which is specifically as below: weighing individual components in respective parts by mass, respectively, then adding the copper surface passivation composition, a water-soluble organic solvent, an alkali and a polyol into deionized water at room temperature, and stirring thoroughly to mix uniformly, to give a uniform and transparent photoresist stripper.

Alternatively, another preparation method is specifically as below: weighing individual components in respective parts by mass, respectively, adding a water-soluble organic solvent, an alkali, and a polyol into deionized water at room temperature to give a mixed solution, then adding the copper surface passivation composition into the mixed solution with stirring until uniformly mixed, to give a uniform and transparent photoresist stripper.

It is found by the inventor that, when the photoresist stripper contains the copper surface passivation composition, it can achieve both excellent photoresist stripping effect and low copper corrosion rate.

Therefore, in the fourth aspect of the present invention, it provides use of the copper surface passivation composition for inhibition of copper corrosion.

Also therefore, in the fifth aspect of the present invention, it is provided use of the copper surface passivation composition for preparation of the photoresist stripper.

In the sixth aspect of the present invention, it is provided a method for cleaning copper substrate photoresist residues, the cleaning method is specifically as below: at 35-45° C., immersing a photoresist-loaded copper substrate in the photoresist stripper, or spraying the photoresist stripper onto the copper substrate, the duration of immersing or spraying is 5-40 minutes, followed by rinsing with ultrapure water, and blowing to dry with high-purity nitrogen to complete the cleaning process of the copper substrate.

In the cleaning method, the duration of immersing or spraying is 5-40 minutes, e.g., 5 minutes, 10 minutes, 15 minutes, 20 minutes, 25 minutes, 30 minutes, 35 minutes, or 40 minutes.

In the cleaning method, the ultrapure water is deionized water with a resistance of at least 18 MΩ at 25° C.

Wherein, the amount of ultrapure water is not particularly strictly limited, as long as the copper substrate can be sufficiently rinsed thoroughly and completely, and the person skilled in the art can make a suitable selection of the amount and determine the rinsing end point.

In the cleaning method, the high-purity nitrogen is nitrogen with a volume purity greater than 99.999%.

The ultrapure water and high-purity nitrogen can be both commercially available and will not be described in detail.

As described above, the present invention provides a copper surface passivation composition, use thereof, and a photoresist stripper containing same and a preparation method therefor and use thereof, as well as a method for cleaning a copper substrate using the stripper. These technical solutions have the following advantages:

1. The copper surface passivation composition performs excellently in inhibiting the copper corrosion, showing a very low copper corrosion rate, so that it can be used in the bumping process of copper wires or copper pillar bumps.

2. The photoresist stripper containing the copper surface has not only an excellent photoresist stripping performance, but also an excellent low copper corrosion rate, so it can be used for photoresist removal in the bumping process of semiconductor back-end packaging.

3. After cleaning with the photoresist stripper, it only requires simple treatment, such as pure water rinsing and nitrogen blow-drying, without the need of organic solvent rinsing, greatly reducing the pollution of the environment and avoiding a large amount of organic waste liquid, which is friendly to environment.

4. No special process is necessarily required for the cleaning process, and ultrasonic treatment is not required, either. It only requires immersing or spraying to remove a variety of impurities on the copper substrate, with a complete decontamination effect and no contaminant residues.

Figure 5:
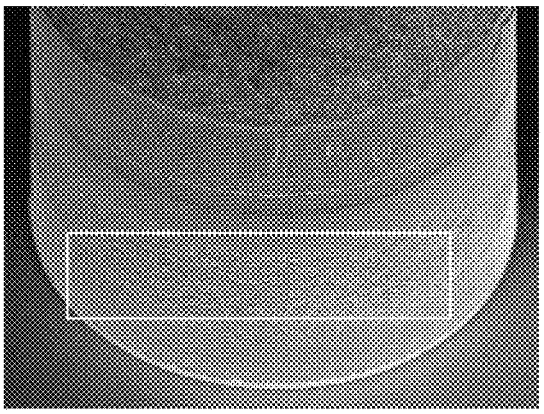
FIG. 5 shows a scanning electron microscope image of a copper pillar bump after cleaning with the photoresist stripper D6, herein the magnification is 2800 times.
Figure 6:
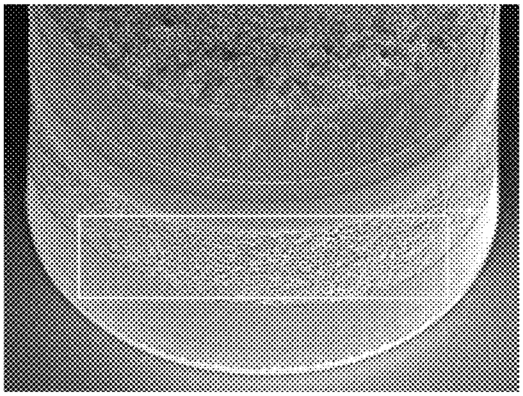
FIG. 6 shows a scanning electron microscope image of a copper pillar bump after cleaning with the photoresist stripper solution D11, herein the magnification is 2800 times.
Figure 7:
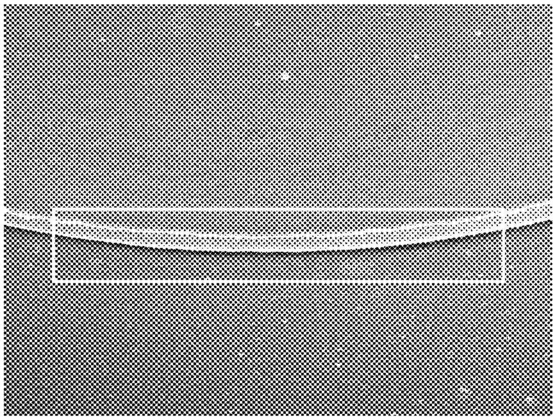
FIG. 7 shows a scanning electron microscope image of the bottom area locally magnified from the copper pillar bump in FIG. 3, herein the magnification is 10000 times.
Figure 8:
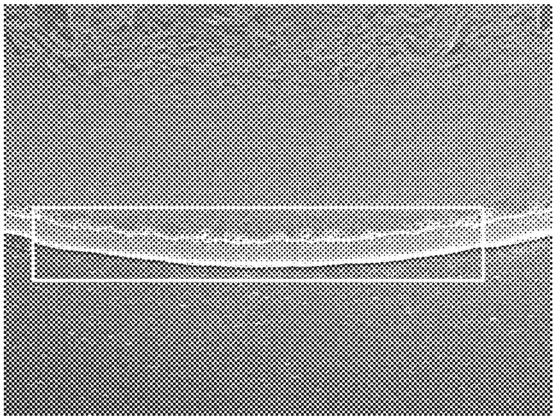
FIG. 8 shows a scanning electron microscope image of the bottom area locally magnified from the copper pillar bump in FIG. 4, herein the magnification is 10000 times.

Herein, the rectangular boxes in FIGS. 3-6 show the side walls of the copper pillars, while the rectangular boxes in FIGS. 7-8 show the bottom areas of the copper pillars.

DETAILED DESCRIPTION

The present invention will be described in detail below by specific examples, but the use and purposes of these exemplary embodiments are only used to exemplify the present invention, and are not intended to limit the actual protection scope of the present invention in any form, much less to limit the protection scope of the present invention thereto.

Where, unless otherwise specified, the individual components used in step 2 in each example or comparative example are the corresponding components weighed in the corresponding step 1.

Example 1: Preparation of a Photoresist Stripper

Step 1: weighing individual components in parts by mass as below, respectively: 0.5 part of a copper surface passivation composition (a mixture of 4-(2-pyridineazo) resorcinol and N-acetyl-D-glucosamine at a mass ratio of 1:3), 75 parts of a water-soluble organic solvent diethylene glycol monoethyl ether, 21 parts of an alkali N-ethyl ethanolamine, 17.5 parts of a polyol 1,3-propanediol, and 5.5 parts of deionized water;

Step 2: adding the copper surface passivation composition, the water-soluble organic solvent, the alkali, and the polyol into deionized water at room temperature, and stirring thoroughly to mix uniformly, to give a uniform and transparent photoresist stripper, named as G1.

Example 2: Preparation of a Photoresist Stripper

Step 1: weighing individual components in parts by mass as below, respectively: 1 part of a copper surface passivation composition (a mixture of 4-(2-pyridineazo) resorcinol and N-acetyl-D-glucosamine at a mass ratio of 1:3), 60 parts of a water-soluble organic solvent dimethyl sulfoxide, 40 parts of an alkali benzyl trimethyl ammonium hydroxide, 5 parts of polyol diethylene glycol, and 10 parts of deionized water;

Step 2: adding the water-soluble organic solvent, the alkali, and the polyol into deionized water at room temperature to give a mixed solution, then adding a copper surface passivation composition into the mixed solution with stirring, and stirring thoroughly to mix uniformly, to give a uniform and transparent photoresist stripper, named as G2.

Example 3: Preparation of a Photoresist Stripper

Step 1: weighing individual components in parts by mass as below, respectively: 0.01 part of a copper surface passivation composition (a mixture of 4-(2-pyridineazo) resorcinol and N-acetyl-D-glucosamine at a mass ratio of 1:3), 90 parts of a water-soluble organic solvent sulfolane, 2 parts of an alkali tetramethylammonium hydroxide, 30 parts of polyol ethylene glycol, and 1 part of deionized water;

Step 2: adding the copper surface passivation composition, the water-soluble organic solvent, the alkali, and the polyol into deionized water at room temperature, and stirring thoroughly to mix uniformly, to give a uniform and transparent photoresist stripper, named as G3.

Example 4-5: Preparation of Photoresist Strippers

Example 4: Except replacing the water-soluble organic solvent diethylene glycol monoethyl ether used in Example 1 with an equal mass fraction of N-methylformamide and replacing the alkali N-ethyl ethanolamine used in Example 1 with an equal mass fraction of diisopropanolamine, all other operations remain unchanged, and the resulting photoresist stripper is named as G4.

Example 5: Except replacing the water-soluble organic solvent dimethyl sulfoxide used in Example 2 with an equal mass fraction of N-methyl pyrrolidone and replacing the alkali benzyltrimethyl ammonium hydroxide used in Example 2 with an equal mass fraction of diglycolamine, all other operations remain unchanged, and the resulting photoresist stripper is named as G5.

Example 6-8: Preparation of Photoresist Strippers

Except replacing the N-acetyl-D-glucosamine used in Examples 1-3 with D-glucosamine, chitosan oligosaccharide and carboxymethyl chitosan, respectively, all other operations remain unchanged, and the resulting photoresist strippers are successively named as G6, G7 and G8.

Example 9-12: Preparation of Photoresist Strippers

Except changing the mass ratio of 4-(2-pyridineazo) resorcinol to N-acetyl-D-glucosamine from 1:3 as used in Example 1 to 1:2, 1:4, 1:1, and 1:5, respectively, all other operations remain unchanged, and the resulting photoresist stripper are successively named as G9, G10, G11, and G12.

Comparative Examples 1-5: Preparation of Photoresist Strippers

Except replacing the copper surface passivation composition used in Examples 1-5 with the same mass fraction of a single component 4-(2-pyridineazo) resorcinol, respectively, all other operations remain unchanged, and the resulting photoresist strippers are successively named as D1, D2, D3, D4, and D5.

Comparative Examples 6-10: Preparation of Photoresist Strippers

Except replacing the copper surface passivation composition used in Examples 1-5 with the same mass fraction of a single component N-acetyl-D-glucosamine, respectively, all other operations remain unchanged, and the resulting photoresist strippers are successively named as D6, D7, D8, D9, and D10.

Comparative Examples 11-15: Preparation of Photoresist Strippers

Except omitting the copper surface passivation composition used in Examples 1-5, respectively, all other operations remain unchanged, and the resulting photoresist strippers are successively named as D11, D12, D13, D14, and D15.

Cleaning Performance Test of Individual Photoresist Stripper

In the manufacturing process of copper pillar bumps, after the electroplating of the copper pillar bumps, the photoresist needs to be removed by cleaning. The cleaning process is specifically as below: at 40° C., directly immersing a photoresist-loaded copper substrate in the individual photoresist stripper as obtained above, respectively, or spraying the individual photoresist stripper onto the copper substrate, the duration of immersing or spraying is 30 minutes, followed by rinsing with ultrapure water (with a resistance of at least 18 MΩ at 25° C.), and then blowing to dry with high-purity nitrogen (with a volume purity greater than 99.999%), to complete the cleaning treatment of the copper substrate.

Figure 1:
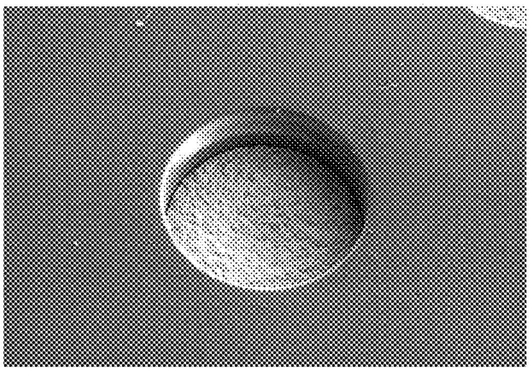
FIG. 1 shows a scanning electron microscope image of a copper pillar bump with the photoresist not removed, herein the magnification is 500 times.

Qualitative Analysis of Cleaning and Copper Surface Passivation Results of Individual Photoresist Stripper 1. FIG. 1 shows a copper pillar bump after the electroplating process and before cleaning the photoresist. Herein, the height of the bump is lower than that of the photoresist.

Figure 2:
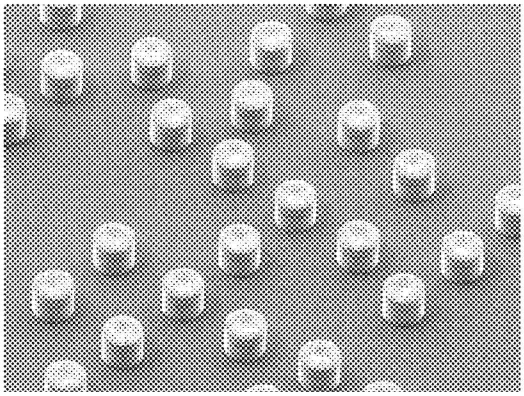
FIG. 2 shows a scanning electron microscope image of copper pillar bumps after cleaning with the photoresist stripper G1, herein the magnification is 250 times.

2. As shown in FIG. 2, after cleaning with the photoresist stripper G1, there are not any residues on the surface of the bumps, and the photoresist is thoroughly, completely removed.

Figure 3:
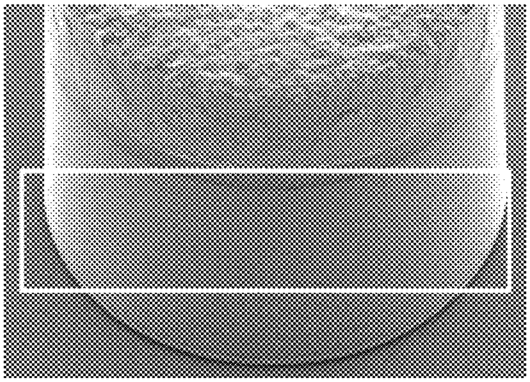
FIG. 3 shows a magnified scanning electron microscope image of a single copper pillar bump in FIG. 2, herein the magnification is 2780 times.

3. As shown in FIG. 3, after cleaning the copper pillar bumps with the photoresist stripper G1, there are not any photoresist residues on the side wall surface of the copper pillar, indicating that the excellent cleaning performance of G1; and the side wall surface of the copper pillar is smooth without any corrosion, indicating that the copper surface passivation protection effect is excellent.

At the same time, it can also be seen that, the bottom area of the copper pillar is not corroded.

The effect of the magnified images after cleaning with G2-G5 is exactly the same as in FIG. 2, so they will not be listed one by one.

The magnified images after cleaning with G6-G8 and G9-G12 are similar to FIG. 2, but there is very slight corrosion in the bottom area of the side wall of the copper pillar (however, it cannot be seen clearly from the magnified images, so the data will be quantified in the subsequent copper corrosion rate test). This demonstrates that the mass ratio of 4-(2-pyridineazo) resorcinol to N-acetyl-D-glucosamine in the copper surface passivation composition is most preferably 1:3, but the entire range of 1:1-5 still has excellent copper surface passivation protection effect and can still be used for continued processing in subsequent processes.

Figure 4:
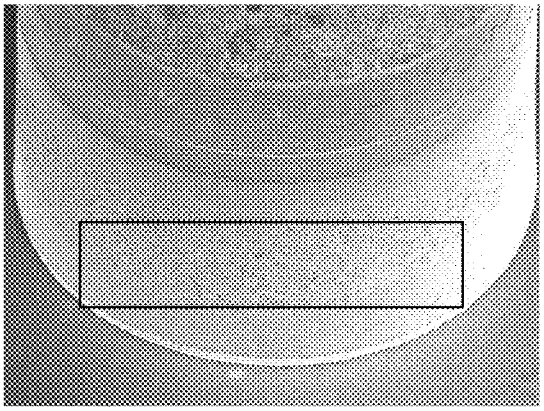
FIG. 4 shows a scanning electron microscope image of a copper pillar bump after cleaning with the photoresist stripper D1, herein the magnification is 2800 times.

4. As shown in FIG. 4, it can be clearly seen from the copper pillar bump after cleaning with the photoresist stripper D1 that the photoresist on the whole copper pillar bump is cleaned thoroughly and completely without any residues, indicating that the photoresist stripper D1 has a good cleaning effect.

It can also be seen that there is some corrosion in the bottom area of the copper pillar.

At the same time, it can be seen that the side wall of the copper pillar is uneven and corroded obviously, indicating that the passivation protection effect to the copper surface is reduced significantly when 4-(2-pyridineazo) resorcinol is used alone, and the copper pillar cannot be used in the subsequent processes.

The effect of the magnified images after cleaning with D2-D5 is highly similar to that in FIG. 3, so they will not be listed one by one.

5. As shown in FIG. 5, it can be clearly seen from the copper pillar bump after cleaning with the photoresist stripper D6 that the photoresist on the whole copper pillar bump is cleaned thoroughly and completely without any residues, indicating that the photoresist stripper D6 performs well in cleaning.

However, the side wall of the copper pillar is uneven and corroded obviously to an extent more serious than that in FIG. 4, indicating that the passivation protection effect to the copper surface is reduced more significantly when N-acetyl-D-glucosamine is used alone, and the copper pillar cannot be used in the subsequent processes.

At the same time, it can also be seen that some corrosion occurred in the bottom area of the copper pillar.

The effect of the magnified images after cleaning with D7-D10 is highly similar to that in FIG. 5, so they will not be listed one by one.

6. As shown in FIG. 6, it can be clearly seen from the copper pillar bump after cleaning with the photoresist stripper D11 that the photoresist on the whole copper pillar bump is cleaned thoroughly and completely without any residues, indicating that the photoresist stripper D11 performs well in cleaning.

However, the side wall of the copper pillar is uneven most obviously and corroded to an extent more serious than that in FIGS. 4-5, indicating that when the stripper is lack of the copper surface passivation composition in the present invention, the copper surface is corroded very severely and the copper pillar cannot be used in the subsequent processes at all.

At the same time, it can also be seen that there is obvious corrosion in the bottom area, which is more serious than that in FIGS. 4-5 obviously (at this point it is obvious that the corrosion is at its worst, so it is unnecessary for magnified scanning display).

The effect of the magnified images after cleaning with D12-D15 is highly similar to that in FIG. 6, so they will not be listed one by one.

7. FIG. 7 shows a scanning electron microscope image locally magnified (at 10000× magnification) of the bottom area of the copper pillar in FIG. 3 after using the photoresist stripper G1, from which it can be seen that the bottom area of the copper pillar is not corroded. For the same local part after using the photoresist stripper G2-G5 respectively, which is also magnified by 10000 times, copper is not corroded either, so the images are not listed one by one.

8. FIG. 8 shows a scanning electron microscope image locally magnified (at 10000× magnification) of the bottom area of the copper pillar in FIG. 4 after using the photoresist stripper D1, from which it can be seen that there are obvious corrosion pits in the bottom area of the copper pillar. For the same local part after using the photoresist stripper D2-D10 respectively, which is also magnified by 10000 times, substantially similar corrosion pits (the corrosion situation and the depth of pits are substantially the same) also appear, so the images are not listed one by one.

In conclusion, the passivation protection ability of different photoresist stripper on Cu can be accurately and qualitatively determined from the scanning electron microscope images, wherein G1-G5 have very excellent copper surface passivation protection ability. When the copper surface passivation composition is changed to a single component, its passivation ability is reduced significantly (the effect of the single component 4-(2-pyridineazo) resorcinol is superior to that of the single component N-acetyl-D-glucosamine), and when the copper surface passivation composition of the present invention is not used, the copper surface is corroded most seriously. It demonstrates that the best technical effect can be achieved only when the copper surface passivation composition as defined in the present invention is used. This should be due to a good complex synergic effect between 4-(2-pyridineazo) resorcinol and N-acetyl-D-glucosamine. The inventor believes that it should be due to the fact that the pyridine ring of 4-(2-pyridylazo) resorcinol is connected to the benzene ring through conjugated nitrogen-nitrogen double bonds, forming a large conjugated network with a high electron cloud density, whereas —OH and —$NH_2$, which contain lone electron pairs, can be bonded to the surface of Cu, so that the molecule can be stably adsorbed and immobilized to the surface of Cu, thus protecting the Cu from external erosion, whereas the N-acetyl-D-glucosamine can be adsorbed to the surface of Cu through —OH. It is speculated that the synergic effect of the two compounds when they are combined may be due to the fact that when the two compounds are adsorbed on the Cu surface at a certain ratio at the same time, a highest molecular adsorption amount may be achieved on the Cu surface (because of the differences in the adsorption sites of different molecules, an adsorption film with a greater density may be formed when molecules with different structures act jointly), thereby achieving the best Cu protection effect. The inventor will conduct further in-depth research on this.

Quantitative Test of Individual Photoresist Strippers on the Passivation of Copper Surface In order to obtain more accurate data on the passivation protection of copper surfaces, ICP-MS (Inductively Coupled Plasma Mass Spectrometry) is used by the inventor to conduct a more accurate quantitative test. The test method is specifically as below: directly immersing photoresist-loaded copper pillar bump samples of size 4×4 cm in the individual photoresist strippers obtained above at 40° C. for a period of 30 minutes, then measuring the concentration of metal ions in the strippers by means of ICP-MS, and calculating the respective corrosion rate (Å/min, i.e., Å/minute, also may be referred to as "etching rate"), thereby investigating the corrosion rates of different photoresist strippers on the metallic copper, with the test results shown in Table 1 below:

TABLE 1

Corrosion rates of metallic Cu by different strippers

| Photoresist stripper | Cu corrosion rate (Å/min) |
|---|---|
| G1-G5 | 0.11/0.17/0.13/0.12/0.13 |
| G6-G8 | 0.48/0.41/0.65 |
| G9-G12 | 0.25/0.28/0.45/0.52 |
| D1-D5 | 6.5/7.1/6.2/6.8/7.6 |
| D6-D10 | 9.3/8.5/8.2/8.7/9.4 |
| D11-D15 | 15.7/16.5/16.1/17.3/16.9 |

Herein, there is a one-to-one correspondence between the photoresist stripper and the Cu corrosion rate. Take G1-G5 as an example, the Cu corrosion rate (Å/min) is "0.11/0.17/0.13/0.12/0.13", meaning that the corrosion rates (Å/min) for G1, G2, G3, G4, and G5 are 0.11, 0.17, 0.13, 0.12 and 0.13, respectively. There is also the same corresponding reference relationship between other photoresist strippers and Cu corrosion rates, and it will not be described here one by one.

It can be seen from Table 1 above that, the photoresist strippers G1-G5 of the present invention have excellent ability of copper surface passivation protection with a very low corrosion rate. However, when the glucosamine derivative therein is replaced, it is found that the copper corrosion rate increases (see G6-G8), indicating that N-acetyl-D-glucosamine is the optimal selection (especially for G6, the corrosion rate increases significantly when the N-acetyl-D-glucosamine is simply replaced by D-glucosamine). When the mass ratio of 4-(2-pyridineazo) resorcinol to glucosamine derivatives is changed, the corrosion rate also increases. Moreover, it can be seen that the wider deviation from the optimal mass ratio of 1:3, the greater the corrosion rate is (the mass ratio in G9-G12 is 1:2, 1:4, 1:1 and 1:5, respectively, and the corrosion rate is 0.25, 0.28, 0.45, 0.52 in turn, indicating that the wider deviation from 1:3, the greater the corrosion rate is). When the copper surface passivation composition is changed from dual-component to single-component, the corrosion rate increases very significantly (see D1-D5 and D6-D10, while the corrosion rate for D6-D10 is significantly greater than that for D1-D5, also complying with the qualitative characterization in the drawings). Most significantly, when the copper surface passivation composition of the present invention is not used, the corrosion rate reaches the maximum (see D11-D15), and the Cu corrosion is the most serious.

As described above, the present invention provides a copper surface passivation composition and use thereof, a photoresist stripper containing the copper surface passivation composition, a preparation method for the photoresist stripper and use thereof and a method for cleaning a copper substrate using the stripper. By the use of a dual-component compound, the selection of optimal components and the optimal selection of amount, the copper surface passivation composition achieves excellent technical effects, so that the photoresist stripper not only has excellent cleaning performance, but also has excellent copper passivation protection effect, enabling it to be used for photoresist removal and copper surface protection in the bumping process of semiconductor back-end packaging with good industrial application prospects and promotion potential in the technical field of microelectronics.

It should be understood that, these examples are only used to illustrate the present invention and are not intended to limit the scope of protection of the present invention. In addition, it should also be understood that various changes, modifications and/or variations can be made to the present invention by those skilled in the art after reading the technical contents of the present invention, and all these equivalents also fall within the scope of protection as defined by the appended claims of the present application.

The invention claimed is:

1. A photoresist stripper, wherein the photoresist stripper comprises, in parts by mass, the following components:

| | |
|---|---|
| copper surface passivation composition | 0.01-1 |
| water-soluble organic solvent | 60-90 |
| alkali | 2-40 |
| polyol | 5-30 |
| deionized water | 1-10 |

wherein, the copper surface passivation composition comprises 4-(2-pyridylazo) resorcinol and a glucosamine derivative.

2. The photoresist stripper according to claim 1, wherein the water-soluble organic solvent is any one of sulfone, sulfoxide, alcohol ether, amide, and pyrrolidone, or a combination of any multiple thereof.

3. The photoresist stripper according to claim 2, wherein the sulfone is sulfolane.

4. The photoresist stripper according to claim 2, wherein the sulfoxide is dimethyl sulfoxide.

5. The photoresist stripper according to claim 2, wherein the alcohol ether is any one of ethylene glycol monomethyl ether, ethylene glycol monoethyl ether, ethylene glycol monobutyl ether, diethylene glycol monomethyl ether, diethylene glycol monoethyl ether, diethylene glycol monobutyl ether, propylene glycol monomethyl ether, propylene glycol monoethyl ether, and propylene glycol monobutyl ether, or a combination of any multiple thereof.

6. The photoresist stripper according to claim 2, wherein the amide is any one of N-methylformamide, N,N-dimethylformamide, N,N-dimethylacetamide, acetamide, N-ethylformamide, and N,N-diethylformamide, or a combination of any multiple thereof.

7. The photoresist stripper according to claim 2, wherein the pyrrolidone is N-methyl pyrrolidone or N-ethyl pyrrolidone, or a combination of these two in any proportion.

8. The photoresist stripper according to claim 1, wherein the alkali is an organic alkali.

9. The photoresist stripper according to claim 8, wherein the organic alkali is quaternary ammonium hydroxide or alkanolamine.

10. The photoresist stripper according to claim 1, wherein the polyol is any one of ethylene glycol, diethylene glycol, 1,2-propanediol, and 1,3-propanediol, or any combination of any multiple thereof.

11. The photoresist stripper according to claim 1, wherein a mass ratio of the 4-(2-pyridylazo) resorcinol to the glucosamine derivative is 1:1-5.

12. The photoresist stripper according to claim 1, wherein a mass ratio of the 4-(2-pyridylazo) resorcinol to the glucosamine derivative is 1:2-4.

13. The photoresist stripper according to claim 1, wherein a mass ratio of the 4-(2-pyridylazo) resorcinol to the glucosamine derivative is 1:3.

14. The photoresist stripper according to claim 1, wherein the glucosamine derivative is any one of D-glucosamine, N-acetyl-D-glucosamine, and carboxymethyl chitosan.

15. The photoresist stripper according to claim 14, wherein a mass ratio of the 4-(2-pyridylazo) resorcinol to the glucosamine derivative is 1:1-5.

16. The photoresist stripper according to claim 14, wherein a mass ratio of the 4-(2-pyridylazo) resorcinol to the glucosamine derivative is 1:2-4.

17. The photoresist stripper according to claim 14, wherein a mass ratio of the 4-(2-pyridylazo) resorcinol to the glucosamine derivative is 1:3.

18. The photoresist stripper according to claim 1, wherein the copper surface passivation composition consists of the 4-(2-pyridylazo) resorcinol and N-acetyl-D-glucosamine in a mass ratio of 1:3.

19. A preparation method of making the photoresist stripper of claim 1, the method comprises mixing the copper surface passivation composition, the water-soluble organic solvent, the alkali, the polyol, and the deionized water together to form a uniform and transparent mixture.

20. A method for cleaning a photoresist residue on a copper substrate, the cleaning method comprising: applying the photoresist stripper of claim 1 onto the copper substrate via immersion or spraying for 5-40 minutes, followed by rinsing the copper substrate with ultrapure water, and followed by blowing the copper substrate with high-purity nitrogen to dry the copper substrate.

* * * * *